United States Patent
Takei et al.

(10) Patent No.: US 7,084,516 B2
(45) Date of Patent: Aug. 1, 2006

(54) SURFACE PROTECTION FILM

(75) Inventors: Atsushi Takei, Gunma (JP); Hisatsugu Tokunaga, Gunma (JP); Mikio Shimizu, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 89 days.

(21) Appl. No.: 10/483,270

(22) PCT Filed: Jul. 15, 2002

(86) PCT No.: PCT/JP02/07177

§ 371 (c)(1),
(2), (4) Date: Jan. 16, 2004

(87) PCT Pub. No.: WO03/008134

PCT Pub. Date: Jan. 30, 2003

(65) Prior Publication Data

US 2004/0169290 A1    Sep. 2, 2004

(30) Foreign Application Priority Data

| Jul. 16, 2001 | (JP) | ................ 2001-214968 |
| Jul. 16, 2001 | (JP) | ................ 2001-214969 |
| Jan. 15, 2002 | (JP) | ................ 2002-005867 |
| Jul. 4, 2002  | (JP) | ................ 2002-195465 |

(51) Int. Cl.
*H01L 29/40*    (2006.01)

(52) U.S. Cl. ............................ 257/783; 257/785
(58) Field of Classification Search ............ 257/783, 257/785; 438/118; 428/40.01
See application file for complete search history.

(56) References Cited

U.S. PATENT DOCUMENTS 5,516,456 A * 5/1996 Shinohara et al. ...... 252/299.01
6,582,789 B1 * 6/2003 Sumi ...................... 428/40.1

FOREIGN PATENT DOCUMENTS

| JP | 58 191777  | 11/1983 |
| JP | 61 272279  | 12/1986 |
| JP | 02 063830  | 3/1990  |
| JP | 02 073307  | 3/1990  |
| JP | 04 292943  | 10/1992 |
| JP | 09 040924  | 2/1997  |
| JP | 2000 026817 | 1/2000 |
| JP | 2001 031924 | 2/2001 |
| JP | 2001 096698 | 4/2001 |

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

A surface protection film which comprises a substrate layer and an adhesive layer, and of which the electrostatic charge by peeling from an adherend is from +0.01 to −0.01 $nC/mm_2$.

10 Claims, 1 Drawing Sheet

SURFACE PROTECTION FILM

TECHNICAL FIELD

The present invention relates to a surface protection film and a paster employing it. The surface protection film of the present invention is useful in the process for producing semiconductors or for a liquid crystal display surface. It is particularly useful for a surface subjected to surface-roughening treatment, such as a liquid crystal display surface subjected to anti-glare treatment.

BACKGROUND ART

A liquid crystal display is prepared by laminating a polarizing plate on at least one side (usually on each side) of a liquid crystal cell having liquid crystal sealed in between a pair of substrates. As the polarizing plate, it is common to employ one prepared by having a polyvinyl alcohol type film dyed with iodine or a dichromatic dye, stretching it for orientation in a predetermined direction to form a polarizing film, and laminating, on each side of the polarizing film, a triacetyl cellulose film having no optical isomerism and being excellent in transparency, as a protecting film. In the process for assembling a liquid crystal display or in the distribution process of a polarizing plate, a surface protection film is stuck on the surface of the polarizing plate opposite to the adhesive layer of the polarizing plate, to prevent damages or soiling. As the surface protection film, it is common to employ one having an adhesive coated on one side of e.g. a polyester film or a polypropylene film. The surface protection film is peeled off, when the liquid crystal display is to be used, or when the liquid crystal display is to be tested for evaluation of e.g. the display ability, the color, the contrast, etc.

Surface protection films having antistatic treatment applied, are reported in JP-A-2000-026817, JP-A-2000-085068, JP-A-05-331431 and JP-A-09-207259.

In JP-2001-096698, a surface protection film having an antifouling layer provided, is reported. Further, surface protection films having the antifouling properties of their surfaces improved, are reported in JP-A-6-256756 and JP-B-6-29332.

The degree of fineness of liquid crystal display has increased, and fine letters can now been displayed. Along with such progress, the density of the TFT drive elements has increased, and the wiring has become thin. It has not been a serious problem that the static electricity generated when the surface protection film is peeled from a liquid crystal display, induces a trouble of attracting dusts. However, as the degree of fineness of liquid crystal display increases, the liquid crystal display tends to receive a direct hazard by static electricity. There has been a problem such that due to static electricity, abnormal display is induced, or malfunction or an electrostatic discharge damage of the TFT drive elements, tends to be led.

Problems relating to the surface protection film are not limited to static electricity.

In a quality test of a polarizing plate, marking is made by an ink to the surface protection film bonded to the polarizing plate. The surface protection film is required to have a nature such that marking can easily be imparted by an ink and it can not easily be removed even by wiping. This is contradictory to such a requirement that the surface protection film should scarcely be soiled. The surface protection film is required to satisfy the opposing or contradictory characteristics, such as the stain proofing property and the ink fixing property at the same time.

The liquid crystal display surface having anti-glare treatment applied, is surface-roughened. When a surface protection film is stuck thereto, the film and the display surface will not adhere intimately, whereby there may sometimes be a problem that fine air bubbles interposed therebetween present a haze or turbidity. With a TFT type liquid crystal display, areas of individual display elements are very small. Accordingly, even fine air bubbles adversely affect the evaluation of visibility. And, it is necessary to carry out an inspection by peeling the surface protection film.

DISCLOSURE OF THE INVENTION

Surface Protection Film Having a Low Electrostatic Charge by Peeling

In order to protect an adherend such as a liquid crystal display having a surface protection film applied thereon, from electrostatic troubles, it is necessary to minimize the electrostatic charge by static electricity generated during peeling of the surface protection film from the adherend. The surface protection film must be such that the electrostatic charge by peeling from the adherend is from +0.01 to −0.01 $nC/mm^2$. In other words, it must be a surface protection film whereby the electrostatic charge by peeling is from +25 to −25 nC when the surface protection film of 25 mm×100 mm is peeled from an adherend of 50 mm×125 mm.

Surface Protection Film Having a Release Film

The surface protection film comprises a substrate layer and an adhesive layer. To protect the adhesive layer, the surface protection film may be wound up into a roll for storage.

A surface protection film having a release film applied to the adhesive layer is convenient for transportation or storage. The release film is peeled off at the time of use.

It is preferred to have the surface of the substrate layer, or the surfaces of the substrate layer and the release film, coated with an antistatic agent and/or a release agent, whereby the surface protection film wound up into a roll can easily be peeled, and generation of static electricity can be prevented. While the release film itself may be susceptible to electrification, it is thereby possible to prevent generation of static electricity when it is peeled.

Surface Protection Film Excellent in Stain Resistance

By forming a layer comprising a surfactant on the surface of the substrate layer, it is possible to obtain a surface protection film which has a good ink printability and stain resistance. For this purpose, the bond strength of the surfactant to the substrate layer must be stronger than the cohesive force of the layer of the surfactant.

Surface Protection Film Having a Plasticizer Incorporated

With a surface protection film having an adhesive layer containing a plasticizer, the surface protection film bonded to an adherend such as a liquid crystal display, can easily be manually peeled. Even when it is bonded to a surface subjected to surface-roughening treatment such as a liquid crystal display surface subjected to anti-glare treatment, it is excellent in adhesion, whereby inspection of the liquid crystal display can easily be carried out while it is bonded to the display surface.

It is a surface protection film having a haze of at most 5% when applied to a polarizing plate with Ra=390 nm, an initial peel strength of from 1.0 to 2.5 N/ϕ 5 mm, a 180° peel strength of from 0.1 to 0.5 N/25 mm at a peeling rate of 5,000 mm/min and a 180° peel strength of from 0.01 to 0.3 N/25 mm at a peeling rate of 300 mm/min against a polarizing plate with Ra=390 nm.

BEST MODE FOR CARRYING OUT THE INVENTION

Construction

Figure 1:
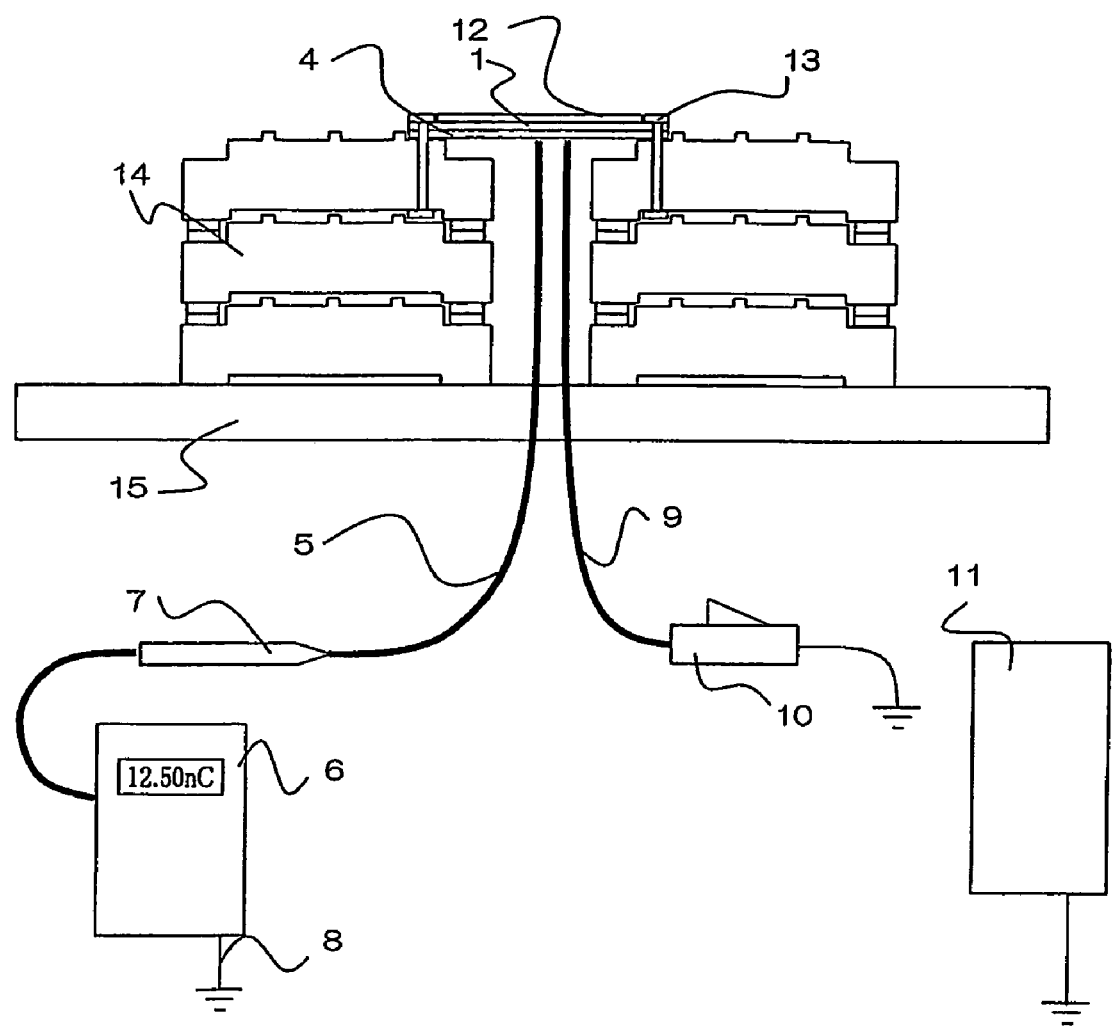
FIG. 1 is a schematic view showing an apparatus for measuring the electrostatic charge by peeling, employed in the present invention. Reference numeral 1 indicates an adherend, 4 a metal plate, 5 a conductor wire, 6 a Coulomb meter, 7 a measuring probe, 8 a conductor wire, 9 a conductor wire, 10 a switch, 11 a destaticizer plate, 12 a surface protection film, 13 a fastening means, 14 an insulator and 15 a metal measurement table.

The surface protection film comprises a substrate layer and an adhesive layer laminated thereon.

To protect the adhesive layer, the surface protection film is sold in such a state as wound up into a roll. At the time of actual use, it is peeled for a necessary length from the roll. To facilitate the peeling, the substrate layer surface on the side which is in contact with the adhesive layer, may be treated with a release agent such as a silicone type release agent or a fluororesin type release agent.

Release Film

A release film may further be laminated on the adhesive layer. Such a release film is peeled off when the surface protection film is actually used.

The release film may be one having the surface of a plastic film treated with a silicone type release agent or other release agent, or a film which has a releasing property by itself. The thickness of the release film is preferably from about 10 to 100 µm. For example, a polyethylene terephthalate film or a polypropylene film may be employed.

Electrostatic Charge by Peeling

On the surface of a liquid crystal display, a surface protection film is applied to protect it from damages during the production. When the liquid crystal display is used, the surface protection film is peeled off. At that time, static electricity will be generated. This static electricity will cause a trouble to a liquid crystal display. The situation is the same also with a plasma display. To protect the liquid crystal display or the plasma display from the trouble of static electricity, it is necessary to minimize static electricity generated when the surface protection film is peeled. Accordingly, it is important to minimize the static electricity generated when the surface protection film is peeled. It is preferred that the electrostatic charge at the time of peeling the surface protection film is from +0.01 to −0.01 nC/mm².

The surface protection film of the present invention has a characteristic such that when it is applied to and peeled from an adherend, the value obtained by dividing the entire electrostatic charge by the area, is within a range of from +0.01 to −0.01 nC/mm². The construction and composition of the surface protection film have to be adjusted to have such a characteristic.

When such a surface protection film is used, it is possible to reduce an abnormal display caused by peeling it from the liquid crystal display.

Also preferred is a surface protection film whereby the electrostatic charge by peeling will be within a range of from +25 to −25 nC when the surface protection film of 25 mm×100 mm is peeled from an adherend of 50 mm×125 mm. This electrostatic charge by peeling corresponds to the same value as above, if it is represented per unit area. The electrostatic charge by peeling can easily be measured by this area.

Method for Measuring the Electrostatic Voltage by Peeling

With respect to the static electricity generated at the time of peeling the surface protection film from an adherend, it is common to measure the electrostatic voltage of the adherend having the surface protection film peeled therefrom. This method has a drawback that the electrostatic voltage changes depending upon the distance from the adherend. In principle, the induced current is measured, whereby it is unavoidable that the electrostatic voltage to be measured, changes as the distance from the adherend changes. Since there is a relation of Q=CV, where Q is the electrostatic charge (C), V is the electrostatic voltage (V) and C is the capacitance (F), the value of the electrostatic voltage changes depending upon the capacitance of the adherend. Even if the electrostatic voltage is low, if its capacitance is large, the actual electrostatic charge may not necessarily be small. In the measurement of the electrostatic voltage, there is another problem such that the measurable range is narrow, and it is not possible to quantitatively measure the degree of the static electricity generated in the entire adherend to be measured. Since the state of static electricity generated in the entire adhered can not be grasped, it is not possible to completely eliminate abnormality in display of a liquid crystal display due to static electricity generated at the time of peeling the surface protection film, even if a surface protection film having an antistatic measure applied, for example, by providing an antistatic layer or an electroconductive resin layer to the surface protection film, is used.

It is difficult to eliminate the trouble due to static electricity simply by reducing the electrostatic voltage, and it is necessary to reduce the electrostatic charge of static electricity generated. Namely, it is important to reduce the electrostatic charge. Heretofore, no attention has been paid to reducing this electrostatic charge.

Method for Measuring Electrostatic Charge by Peeling

FIG. 1 shows an apparatus for measuring the electrostatic charge by peeling, employed in the present invention.

An adherend 1 is placed on a metal plate 4 and fixed by a fastening means 13 so that the adherend 1 will not move.

The adherend 1 may be any adherend so long as the surface protection film may be applied thereto, and the material or shape is not particularly limited. For example, a plastic film, a semiconductor wafer or an electrically conductive material such as a metal, may be mentioned. A non-conductive material such as a triacetyl cellulose resin film used for a liquid crystal display, may suitably be measured. Also one having an electrically conductive material such as carbon black incorporated to a plastic film, or one having an antistatic agent coated on its surface, may be measured. However, if a non-conductive material is thick, it is difficult, in principle, to measure all electrostatic charge generated at the peeled surface of the surface protection film, and accordingly, the thickness is preferably thin, although the measurement can still be made otherwise.

The metal plate 4 may be any plate, so long as it is a plate made of a metal. The metal plate 4 preferably has an area equal to or larger than the adherend, so that all electric flux lines generated by electrostatic charge by peeling on the side which is in contact with the metal plate 4 of the adherend 1, can be captured, so that the precision in measurement can be increased.

By a conductor wire 5, the metal plate 4 is connected to a measuring probe 7 of a Coulomb meter 6 which is an apparatus for measuring the electric charge. The Coulomb meter 6 is connected to the earth by a conductor wire 8 all time. The Coulomb meter is a measuring device of a principle such that a detected electric charge is once stored in a capacitor, and the stored electric charge is measured. A commercial product of such Coulomb meter may be used as it is.

By a conductor wire 9, the metal plate 4 is connected to the earth via a switch 10. Further, a destaticizer plate 11 made of a metal having an area equal to or more than the area of the adhered 1, connected to the earth, is separately prepared. The destaticizer plate 11 may be any plate, so long as it is a plate made of a metal. The destaticizer plate 11 preferably has an area against which the adherend or the surface protection film whichever has a larger area, can be fully in contact.

The metal plate 4 is secured to a metal measuring table 15 via insulators 14 without any electrical connection. The insulators 14 may be any insulators so long as they are electrically insulative and can hardly be electrically charged. For example, ceramics or glass may be employed. Preferred is ceramics.

When the surface protection film 12 stuck on the adherend 1 is peeled, the electric charge generated by peeling will be generated in the adherend 1. At that time, in the metal plate 4 in close contact with the adherend 1, an electric charge of the opposite polarity will be generated, and at the same time, an electric charge having the same polarity as the electric charge generated in the adherend 1 will be transmitted via the conductor wire 5 to the measuring probe 7 of the Coulomb meter 6 and will be displayed on the Coulomb meter 6 as the electrostatic charge by peeling at that time.

By using the metal plate 4, the electric charge generated in the entire adherend 1 by the peeling electrification as described above, can be captured, whereby the electrostatic charge by peeling generated in the entire adherend 1 can be measured.

The electric charge will be generated as the surface protection film 12 is peeled, and accordingly, by plotting this electric charge against the time, it is possible to know the profile of the electrostatic charge by peeling.

The measuring apparatus is preferably shielded by an electroconductive material connected to the earth (not shown in FIG. 1). The electroconductive material is an electrically conductive material. For example, a metal or a metal having holes provided to an extent not to influence the measurement, may be employed. However, the electroconductive material is not limited thereto. Among the measuring apparatus, products in which a resin is used, such as the above-described Coulomb meter 6, the measuring probe 7 and the switch 10, are preferably disposed outside the shield.

By using the measuring apparatus of the present invention, as opposed to the conventional apparatus for measuring the electrostatic voltage, it is possible to measure the electrostatic charge by peeling generated in the entire adherend without receiving an influence of the distance or an influence of the capacitance of the adherend, and it is possible to measure the profile of the electrostatic charge by peeling generated during the peeling of the surface protection film protecting the adherend. Accordingly, in a process for producing a semiconductor or in a process for producing a liquid crystal display, it is possible to measure a very small electric charge which is likely to cause a serious trouble such that an operational failure takes place by dielectric breakdown of a semiconductor, or a semiconductor in a driving system of the liquid crystal display, due to electrostatic charge by peeling generated by the surface protection film itself or by the adherend having the surface protection film used in such a process.

By means of this measuring apparatus, the electrostatic charge by peeling can be measured as follows.

A triacetyl cellulose resin film is used as the surface of a liquid crystal display. For example, by using this film as the adherend 1, a surface protection film is applied thereon, and this surface protection film 12 is peeled. When the surface protection film 12 applied on the adherend 1, is peeled, an electric charge generated by the peeling will be generated in the adherend 1. At that time, in the metal plate 4 which is in close contact with the adherend 1, an electric charge of the opposite polarity will be generated, and at the same time, an electric charge of the same polarity as the electric charge generated in the adherend 1 will be transmitted to the measuring probe 7 of the Coulomb meter 6 via the conductor wire 5 and will be displayed on the Coulomb meter 6 as the electrostatic charge by peeling at that time.

Substrate Layer

The resin to be used for the substrate layer is a transparent resin having a glass transition temperature higher than the temperature applied to the substrate layer in the drying step in coating of the adhesive. It may, for example, be an acrylic resin, a polyester resin, a polyolefin resin, a cellulose resin, a fluororesin having an adhesion-facilitating treatment applied, a polystyrene resin, a polycarbonate resin, a polyamide resin, a polyurethane resin, a polyvinyl chloride resin, an epoxy resin or a phenol resin. Those having such resins alloyed, may also be used. Each of such resins may be one commercially available. These resin compositions may be used alone or in combination as a mixture of two or more of them. Further, other additives may be incorporated. Among them, a polyolefin resin film, or a polyester resin film, is preferred.

The thickness of the substrate layer may be changed depending upon the particular purpose of the surface protection film. It is usually preferably from about 10 to 200 μm.

When used as a surface protection film for a liquid crystal display, a polyethylene terephthalate film having a thickness of from 16 to 100 μm, is preferred, when the handling efficiency as the surface protection film, the transparency, the cost, etc. are taken into account. If it is thin, the handling efficiency tends to be poor as a surface protection film, and if it is thick, the transparency is likely to deteriorate, or the cost is likely to increase. The higher the transparency of the polyethylene terephthalate film, the better. The total light transmittance is preferably at least 80%, more preferably at least 91%. It is preferred that the transparency is high, since it is thereby possible to inspect the liquid crystal panel while the surface protection film is applied thereon.

Adhesive

As the adhesive, a rubber adhesive, an acrylic adhesive, a urethane adhesive or a silicone adhesive may, for example, be mentioned. Preferred is an acrylic adhesive having a glass transition temperature of at least −60° C., more preferably an acrylic adhesive having a glass transition temperature of at least −40° C. The acrylic adhesive is one comprising an alkyl acrylate as the main component. It may be an acrylic polymer having other monomer, for example, a polar monomer component co-polymerized. The alkyl acrylate is an alkyl ester of acrylic acid or methacrylic acid. It is not particularly limited, but it may, for example, be ethyl acrylate, isopropyl acrylate, n-butyl acrylate, isobutyl acrylate, pentyl (meth)acrylate, 2-ethylhexyl (meth)acrylate, isooctyl (meth)acrylate, isononyl (meth)acrylate, decyl (meth)acrylate or lauryl (meth)acrylate.

Crosslinking Agent

The acrylic adhesive can be used as blended with a crosslinking agent.

The crosslinking agent may, for example, be a polyisocyanate compound, such as a fatty acid type diisocyanate, an aromatic diisocyanate or an aromatic triisocyanate.

The amount of the crosslinking agent to be incorporated may be adjusted to from 0.01 to 10 parts by weight, per 100 parts by weight of the acrylic polymer.

Coating of the Adhesive

As a method for coating the adhesive on the substrate layer, a screen method, a gravure method, a mesh method or a bar coating method, may, for example, be used. However, the method is not limited thereto. The thickness of the coated adhesive is not particularly limited. However, it is usually from 1 to 100 μm as the thickness after drying.

Method to Adjust the Electrostatic Charge by Peeling to from −25 to 25 nC

The method to adjust the electrostatic charge by peeling to from −25 to 25 nC, is not particularly limited. It can be accomplished by suitably adjusting the blend ratio of the acrylic adhesive and the crosslinking agent.

The blend ratio may vary depending upon the type of the adhesive. It is preferred that the crosslinking agent is within a range of from 0.01 to 10 parts by weight, per 100 parts by weight of the main agent.

With respect to the blend ratio of the crosslinking agent, the optimum blend ratio used to be determined usually based on the adhesive strength or the adhesive property (tackiness) of the adhesive. No consideration has been paid to the blend ratio from the viewpoint of the degree of electrostatic charge by peeling due to static electricity generated at the time of peeling the surface protection film from the adherend. Within the range where the electrostatic charge by peeling is from −25 to 25 nC, the adhesive strength or the adhesive property (tackiness) of the adhesive agent is not substantially impaired, whereby there is no problem with respect to the practical physical properties.

Coating of an Antistatic Agent or a Release-Facilitating Agent

It is preferred to have an antistatic agent or a release-facilitating agent coated on the surface of the substrate layer, or on the surfaces of the substrate layer and the release film, whereby the surface protection film wound up into a roll, can easily be peeled, and generation of static electricity can be prevented. The release film is susceptible to electrification. It is possible to prevent generation of static electricity when the release film is peeled.

Antistatic Agent

As the antistatic agent, a nonionic agent such as a poly(oxyethylene) alkylamine, a poly(oxyethylene)alkylamide, a poly(oxyethylene)alkyl ether, a poly(oxyethylene)alkyl phenyl ether, a glycerol fatty acid ester or a sorbitan fatty acid ester, an anionic agent such as an alkyl sulfonate, an alkyl benzene sulfonate, an alkyl sulfate or an alkyl phosphate, a cationic agent such as quaternary ammonium chloride, quaternary ammonium sulfate or quaternary ammonium nitrate, or an amphoteric agent such as an alkylbetaine type, an alkylimidazoline type or an alkylalanine type, may be used. Preferred is an amphoteric agent such as an alkylbetaine type, an alkylimidazoline type or an alkylalanine type.

Release Facilitating Agent

As the release facilitating agent, a silicone type or fluorine type emulsion, a silicone type or fluorine type surfactant, or a dialkylsulfosuccinic acid ester salt, may, for example, be used.

Surface Protection Film Excellent in Stain Resistance

A surface protection film on which an ink can easily be printed and stain will scarcely remain, can be obtained by forming a layer comprising a surfactant on the surface of a substrate layer. For this purpose, the bond strength of the surfactant to the substrate layer must be stronger than the cohesive force of the layer of the surfactant.

Low Cohesiveness

As the surfactant, one having a low molecular weight and low cohesiveness, is used. The low cohesiveness is set as an index to show that the bond strength of the surfactant to the base film is stronger than the cohesive force of the surfactant layer itself on the basis that after an adhesive tape "tradename: Cellotape CT405A-24" of Nichiban Company is bonded to a surfactant layer coated and dried on a film, and then peeled at 180° at a speed of 300 mm/min by a method in accordance with JIS Z0237, the surfactant component is detected on the coated surface of the film and on the surface of the adhesive tape. For the identification of the component, the surface analyzing method such as an infrared spectrophotometry may be mentioned, but the method is not limited thereto. By coating, on the surface, a surfactant such that in the above evaluation, transfer to the adhesive tape is confirmed, it is possible to obtain a film having an antifouling property and being excellent in the adhesion of an ink on the surface.

Surfactant

As the surfactant, one containing a silicone type compound or a fluorine type compound, one having an antistatic performance, or a mixture thereof, may be employed.

As the silicone type surfactant, one containing a compound such as dimethyl silicone, a cyclic silicone, a phenyl modified silicone or a polyether modified silicone, may, for example, be mentioned.

As the fluorine type surfactant, one containing a compound such as a sodium fluoroalkylbenzene sulfonate, a sodium fluoroalkylcarboxylate, a fluoroalkylpolyoxyethylene ether, a diglyceroltetrakisfluoroalkylammonium iodide or a fluoroalkylbetaine, may be mentioned.

As the surfactant having an antistatic property, an anion surfactant such as an alkyl sulfuric acid ester, an alkyl aryl sulfonic acid or an alkyl phosphoric acid ester, a cationic surfactant such as a quaternary ammonium salt or imidazoline, an amphoteric surfactant such as an alkylbetaine, an alkylimidazoline or an alkylalanine, or a nonionic surfactant such as a sorbitan fatty acid ester, a glycerol fatty acid ester, a poly(oxyethylene)alkylamine or a poly(oxyethylene)alkyl ether, may, for example, be optionally used. Among them, an alkylbetaine is preferred. Particularly preferred is dimethylalkyl (coconut) betaine, since it has effects not only as an antistatic agent but also as a surfactant.

For coating on the film surface, these surfactants may be used alone or in combination as a mixture. Further, they may be used as diluted by a suitable solvent.

Adhesive

As the adhesive to be used in the present invention, a conventional one such as a solvent type, an emulsion type, a hot melt type or a reactive type, may be used. The adhesive may further contain an optionally selected tackifier in order to impart a even better adhesive property. The tackifier to be used in such a case may suitably be selected from e.g. a rosin type, a terpene type, a coumarone type, a phenol type, a styrene type and a petroleum type, but it is not particularly limited.

Method for Coating the Surfactant, etc.

As the method for coating the antistatic agent, the release-facilitating agent or the surfactant, a common coating method, such as a roll coating method by means of a commonly used coating equipment such as a gravure coater, an air knife coater, a fountain die coater or a lip coater, a mist method wherein a film is passed through an atmosphere wherein a surfactant is sprayed in a mist state to form a thin film on the surface, a spray method or a bar coating method, may be employed.

For spray coating, an apparatus may be used wherein a zone is provided in which a film is passed in an atmosphere wherein the desired material is sprayed in a mist state by means of a binary fluid nozzle (such as a nozzle manufactured by Kabushiki Kaisha Ikeuchi) which is capable of mixing such a liquid material with compressed air and blowing it to form a mist, and after passing through such a zone, a film is passed through a zone for drying by blowing hot air for the purpose of drying and solidifying the desired material in a liquid state. By such spraying, the antistatic agent or the release-facilitating agent is preferably made to have a particle size of at most 20 μm. Spraying may be carried out once or more times. Different materials may be coated separately. Otherwise, different materials may be mixed and coated.

The thickness of the coating layer is preferably from 1 to 500 nm. If it is thinner than 1 nm, the layer on the surface may fall off when soil, etc. deposit under strong pressure, such being undesirable. On the other hand, if it exceeds 500 nm, cracks are likely to form in the coating film, such being undesirable from the viewpoint of the strength of the coating film. So long as the thickness of the coating layer is within this range, the same surfactant or two or more different surfactants may be coated in lamination on the film. As pretreatment before the coating, corona discharge treatment, chemical treatment or ultraviolet irradiation. treatment may be applied for the purpose of modifying the wetting properties of the film surface.

Surface Protection Film Having a Plasticizer Incorporated

A surface protection film having an adhesive layer containing a plasticizer has a merit in that such a surface protection film stuck to an adherend such as a liquid crystal display, can easily be peeled manually. Even when it is stuck to a surface subjected to surface roughening treatment, such as a liquid crystal display surface subjected to anti-glare treatment, it is excellent in adhesion, whereby inspection of the liquid crystal display will be facilitated even if it is still stuck thereon.

It is a surface protection film having a haze of 5% when bonded to a polarizing plate with Ra=390 nm, an initial peel strength of from 1.0 to 2.5 N/φ 5 mm, a 180° peel strength of from 0.1 to 0.5 N/25 mm at a peeling rate of 5,000 mm/min and a 180° peel strength of from 0.01 to 0.3 N/25 mm at a peeling rate of 300 mm/min against a polarizing plate with Ra=390 nm.

Plasticizer to be Incorporated

As the plasticizer, an adipic acid ester type, a glycol ester type, a sebacic acid ester type, a trimeritic acid ester type, a pyromellitic acid ester type, a phthalic acid ester type or a phosphoric acid ester type may, for example, be used. However, when it is used for an acrylic type adhesive, a phthalic acid ester type plasticizer is preferred. Further, other plasticizers commonly used for an acrylic adhesive, may also be used. The amount of the plasticizer to be blended, varies depending upon the type of the adhesive, and the plasticizer may be incorporated in such an amount that the haze as bonded to a polarizing plate with Ra=390 nm, the initial peel strength, the 180° peel strength at a peeling rate of 5,000 mm/min and the 180° peel strength at a peeling rate of 300 mm/min against a polarizing plate with Ra=390 nm, would be within the above-mentioned ranges. However, in a case of an adherent whereby bleeding out of a plasticizer is undesirable, the type and the amount of the plasticizer to be incorporated, will be restricted. In a case where a phthalic acid ester type plasticizer is incorporated to an acrylic adhesive, it is preferably within a range of from 2 to 40 parts by weight per 100 parts by weight of the solid content of the acrylic adhesive.

Peel Strength

The coating thickness is not particularly critical so long as the haze when stuck to a polarizing plate with Ra=390 nm, the initial peel strength, the 180° peel strength at a peeling rate of 5,000 mm/min and the 180° peel strength at a peeling rate of 300 mm/min against a polarizing plate with Ra=390 nm, after incorporation of the plasticizer, are within the above-mentioned ranges.

The initial peel strength of from 1.0 to 2.5 N/φ 5 mm, the 180° peel strength of from 0.1 to 0.5 N/25 mm at peeling rate of 5,000 mm/min and the 180° peel strength of from 0.01 to 0.3 N/25 mm at a peeling rate of 300 mm/min against a polarizing plate with Ra=390 nm, are preferred as a range wherein the 180° peel strength is not felt as particularly high in manual peeling, and as a range wherein the minimum strength can be maintained so that the surface protection film will not simply be peeled in a state where the surface protection film is not required to be peeled.

Further, to secure the adhesion to a surface subjected to surface roughening treatment such as a liquid crystal display surface subjected to anti-glare treatment, the initial peel strength and the haze when bonded to a polarizing plate with Ra=390 nm will be indices for evaluation for the adhesion. Namely, the initial peel strength of from 1.0 to 2.5 N/φ 25 mm, and the haze of at most 5% when bonded to a polarizing plate with Ra=390 nm, are preferred for the purpose of securing good adhesion.

Applications

The surface protection film is useful as a surface protection film for a liquid crystal display, a plasma display or an organic EL display. Further, it can be used for protection or the like of tapes to be used in a process step for producing semiconductors or in a process step for producing heads of hard disks, or for the protection or the like of substrates of electronic components. Furthermore, it can be used as a surface protection film for metal plates, building materials, furnitures, etc.

EXAMPLES

Example 1

On a polyethylene terephthalate resin film (G2P8, manufactured by Teijin Du Pont K.K.) having a thickness of 38 µm, an acrylic adhesive (Tg of the adhesive: −36° C., manufactured by Soken Chemical & Engineering Co., Ltd., SK1425) having 0.33 part by weight of a crosslinking agent (L-45, manufactured by Soken Chemical & Engineering Co., Ltd.) mixed thereto, was coated by means of a bar coater, dried at 100° C. for two minutes and then aged for 7 days in an environment of 23° C. The coating thickness of the adhesive was 10 µm. The electrostatic charge by peeling of the surface protection film thus obtained, was measured and found to be −14 nC (−0.0056 nC/mm$^2$).

Description of the Measurement/Apparatus for Electrostatic Charge by Peeling

Referring to FIG. 1, an adherend 1 is placed on a metal plate 4 and secured by a fastening mean 13 so that the adherend 1 will not move.

The metal plate 4 may be any plate, so long as it is a plate made of a metal. The metal plate 4 preferably has an area equal to or larger than the adherend, so that all electric flux lines generated by electrostatic charge by peeling on the side which is in contact with the metal plate 4 of the adherend 1, can be captured, so that the precision in measurement can be increased.

By a conductor wire 5, the metal plate 4 is connected to a measuring probe 7 of a Coulomb meter 6 which is an apparatus for measuring the electric charge. The Coulomb meter 6 is connected to the earth by a conductor wire 8 all time. The Coulomb meter is a measuring device of a principle such that a detected electric charge is once stored in a capacitor, and the stored electric charge is measured. A commercial product of such Coulomb meter may be used as it is.

By a conductor wire 9, the metal plate 4 is connected to the earth via a switch 10. Further, a destaticizer plate 11 made of a metal having an area equal to or more than the area of the adhered 1, connected to the earth, is separately prepared. The destaticizer plate 11 may be any plate, so long as it is a plate made of a metal. The destaticizer plate 11 preferably has an area against which the adherend or the surface protection film which ever has a larger area, can be fully in contact.

The metal plate 4 is secured to a metal measuring table 15 via insulators 14 without any electrical connection. The insulators 14 may be any insulators so long as they are electrically insulative and can hardly be electrically charged. For example, ceramics or glass may be employed. preferred is ceramics.

When the surface protection film 12 bonded on the adherend 1 is peeled, the electric charge generated by peeling will be generated in the adherend 1. At that time, in the metal plate 4 in close contact with the adherend 1, an electric charge of the opposite polarity will be generated, and at the same time, an electric charge having the same polarity as the electric charge generated in the adherend 1 will be transmitted via the conductor wire 5 to the measuring probe 7 of the Coulomb meter 6 and will be displayed on the Coulomb meter 6 as the electrostatic charge by peeling at that time.

By using the metal plate 4, the electric charge generated in the entire adherend 1 by the peeling electrification as described above, can be captured, whereby the electrostatic charge by peeling generated in the entire adherend 1 can be measured.

The electric charge will be generated as the surface protection film 12 is peeled, and accordingly, by plotting this electric charge against the time, it is possible to know the profile of the electrostatic charge by peeling.

The measuring apparatus is preferably shielded by an electroconductive material connected to the earth (not shown in FIG. 1). The electroconductive material is an electrically conductive material. For example, a metal or a metal having holes provided to an extent not to influence the measurement, may be employed. However, the electroconductive material is not limited thereto. Among the measuring apparatus, products in which a resin is used, such as the above-described Coulomb meter 6, the measuring probe 7 and the switch 10, are preferably disposed outside the shield.

By using the measuring apparatus of the present invention, as opposed to the conventional apparatus for measuring the electrostatic voltage, it is possible to measure the electrostatic charge by peeling generated in the entire adherend without receiving an influence of the distance or an influence of the capacitance of the adherend, and it is possible to measure the profile of the electrostatic charge by peeling generated during the peeling of the surface protection film protecting the adherend. Accordingly, in a process for producing a semiconductor or in a process for producing a liquid crystal display, it is possible to measure a very small electric charge which is likely to cause a serious trouble such that an operational failure takes place by dielectric breakdown of a semiconductor, or a semiconductor in a driving system of the liquid crystal display, due to electrostatic charge by peeling generated by the surface protection film itself or by the adherend having the surface protection film used in such a process.

Method for Measuring Electrostatic Charge by Peeling

The measurement of the electrostatic charge by peeling was carried out as follows. A triacetyl cellulose resin film shown by an adherend 1 of this apparatus was secured by means of a fastening means 13 to a metal plate 4 (one made of stainless steel having a thickness of 1.5 mm as disclosed in JIS G4305, and the surface state was such that an index was slightly marked by an abrasive paper in a width direction of a test plate with a water resistant abrasive paper of No. 280 as disclosed in JIS R6253, and the surface was uniformly polished in the direction of the length over the entire length until this index was completely disappeared) placed on insulators 14 (ceramics) and having the same area (125 mm×50 mm) as the adherend 1, and each surface protection film having a size of 125 mm×25 mm (the portion to be actually bonded: 100 mm×25 mm) was bonded by a roller in accordance of JIS Z-0237 at a speed of 300 mm/min, (it is also possible to use one having the surface protection film preliminarily bonded to the adherend). A destaticizer plate 11 (one made of a stainless steel and having a thickness of 1.5 mm as disclosed in JIS G4305, and the surface state was such that an index was slightly marked by an abrasive paper in a width direction of a test plate with a water resistant abrasive paper of No. 280 has disclosed in JIS R6253, and the surface was uniformly polished in the direction of the length over the entire length until the index was completely disappeared) was placed on the surface protection film, and at the same time, the switch 10 was switched to connect the metal plate 4 to the earth, followed by standing still for 30 seconds. Thereafter, the destaticizer plate 11 was immediately removed, and the switch 10 was switched to disconnect the metal plate 4 from the earth. By means of a ceramic pincette, the surface protection film was peeled at a rate of about 500 mm/sec, whereby the electrostatic charge by peeling was measured. As the Coulomb meter, NK-1001 manufactured by Kasuga Denki K.K., was used. This test was repeated ten times with respect to each surface protection film, and the average value was obtained.

Example 2

On a polyethylene terephthalate resin film (G2P8, manufactured by Teijin Du Pont K.K.) having a thickness of 38 μm, an acrylic adhesive (Tg of the adhesive: −32° C., manufactured by Soken Chemical & Engineering Co., Ltd., SK1425) having 0.2 part by weight of a crosslinking agent (L-45, manufactured by Soken Chemical & Engineering Co., Ltd.) mixed thereto, was coated by means of a bar coater, dried at 100° C. for two minutes and then aged for 7 days in an environment of 23° C. The coating thickness of the adhesive was 9 μm. The measured value of the electrostatic charge by peeling of the surface protection film thereby obtained, was −18 nC (−0.0072 $nC/mm^2$).

Example 3

On a polyethylene terephthalate resin film (G2P8, manufactured by Teijin Du Pont K.K.) having a thickness of 38 μm, an acrylic adhesive (Tg of the adhesive: −60° C., manufactured by Soken Chemical & Engineering Co., Ltd., SK1491H) having 0.9 part by weight of a crosslinking agent (L-45, manufactured by Soken Chemical & Engineering Co., Ltd.) mixed thereto, was coated by means of a bar coater, dried at 100° C. for two minutes and then aged for 7 days in an environment of 23° C. The coating thickness of the adhesive was 10 μm. The measured value of the electrostatic charge by peeling of the surface protection film thereby obtained, was −25 nC (−0.01 $nC/mm^2$).

Comparative Example 1

On a polyethylene terephthalate resin film (G2P8, manufactured by Teijin Du Pont K.K.) having a thickness of 38 μm, an acrylic adhesive (Tg of the adhesive: −68° C., manufactured by Soken Chemical & Engineering Co., Ltd., SK1495) having 1.01 parts by weight of a crosslinking agent (L-45, manufactured by Soken Chemical & Engineering Co., Ltd.) mixed thereto, was coated by means of a bar coater, dried at 100° C. for two minutes and then aged for 7 days in an environment of 23° C. The coating thickness of the adhesive was 10 μm. The measured value of the electrostatic charge by peeling of the surface protection film thereby obtained, was −29 nC (−0.012 $nC/mm^2$).

The surface protection films of Examples were useful for liquid crystal displays without any abnormal display.

Example 4

On one side of a polyester film (PET-SL, manufactured by Teijin Du Pont Film K.K.) having a thickness of 38 μm, an adhesive solution having 1.0 part by weight of a crosslinking agent (Collonate L-45, manufactured by Nippon Polyurethane Kogyo K.K.) mixed to 100 parts by weight of an acrylic adhesive (SK Dine 1473H, manufactured by Soken Chemical & Engineering Co., Ltd.) as the main agent, was coated in a thickness of about 40 μm by means of a bar coater and dried at 100° C. for two minutes to obtain a surface protection film. The thickness of the adhesive layer at that time was about 10 μm.

Example 5

On one side of a polyester film (PET-SL, manufactured by Teijin Du Pont Film K.K.) having a thickness of 38 μm, an adhesive solution having 0.1 part by weight of a crosslinking agent (Collonate L-45, manufactured by Nippon Polyurethane Kogyo K.K.) mixed to 100 parts by weight of an acrylic adhesive (SK Dine 1495, manufactured by Soken Chemical & Engineering Co., Ltd.) as the main agent, was coated in a thickness of about 40 μm by means of a bar coater and dried at 100° C. for two minutes to obtain a surface protection film. The thickness of the adhesive layer at that time was about 10 μm.

Example 6

On one side of a polyester film (PET-SL, manufactured by Teijin Du Pont Film K.K.) having a thickness of 38 μm, an adhesive solution having 3 parts by weight of a crosslinking agent (B-45, manufactured by Ippousha Yushi Kogyo K.K.) mixed to 100 parts by weight of an acrylic adhesive (SA-415, manufactured by Ippousha Yushi Kogyo K.K.) as the main agent, was coated in a thickness of about 40 μm by means of a bar coater and dried at 100° C. for two minutes to obtain a surface protection film. The thickness of the adhesive layer at that time was about 10 μm.

Comparative Example 2

On one side of a polyester film (PET-SL, manufactured by Teijin Du Pont Film K.K.) having a thickness of 38 μm, an adhesive solution having 10 parts by weight of a crosslinking agent (Collonate L-45, manufactured by Nippon Polyurethane Kogyo K.K.) mixed to 100 parts by weight of an acrylic adhesive (SK Dine 1495, manufactured by Soken Chemical & Engineering Co., Ltd.) as the main agent, was coated in a thickness of about 40 μm by means of a bar coater, and dried at 100° C. for two minutes to obtain a surface protection film. The thickness of the adhesive layer at that time was about 10 μm.

TABLE 1

|  | Ex. 4 | Ex. 5 | Ex. 6 | Comp. Ex. 2 |
| --- | --- | --- | --- | --- |
| Electrostatic charge by peeling (nC) | −22 | −5 | 6 | −50 |

With respect to the films of Examples having low electrostatic charge by peeling, as shown in Table 1, breakdown tests of IC were carried out as follows, whereby good results were obtained.

Evaluation of the Liquid Crystal Display

On the surface of a TFT type liquid crystal display having a triacetyl cellulose film as a protective film, the surface protection film was bonded and left to stand for 30 minutes under conditions of 23° C. and a relative humidity of 50%, whereupon the surface protection film was peeled off. Thereafter, the personal computer was actually activated to confirm the liquid crystal display.

Example 7

Using a polyethylene terephthalate resin film (G2P8, manufactured by Teijin Du Pont K.K.) having a thickness of 38 μm, as the substrate layer, an acrylic adhesive (SK1425, manufactured by Soken Chemical & Engineering Co., Ltd.) having 0.33 part by weight of a crosslinking agent (L-45, manufactured by Soken Chemical & Engineering Co., Ltd.) mixed thereto, was coated to an antistatic treatment surface of this film by means of a comma coater, dried at 100° C. for one minute, and then a polyethylene terephthalate resin film (E7002, manufactured by Toyo Boseki K.K.) having a thickness of 25 μm and having silicone coated on one side, was bonded as a release film on the adhesive surface, to obtain a surface protection film. This surface protection film was passed in an atmosphere wherein an antistatic agent (SAT-4, manufactured by Nihon Junyaku Co., Ltd., which contains a dimethylalkyl (coconut) betaine, as the main component, and, as other components, quaternary ammonium chloride and 5% of a polyoxyethylene alkyl ether) was sprayed in a mist state by means of a mist machine manufactured by Tect Company, to have the antistatic agent coated on the substrate layer surface and the release layer surface of the surface protection film, followed by drying by blowing a hot air of 80° C. for 3 seconds, to obtain a surface protection film. The coating thickness of the adhesive after drying was 10 μm.

Example 8

To a surface protection film prepared in the same manner as in Example 7, a mixture comprising 1 part by weight of a silicone emulsion (FZ4110, manufactured by Nippon Unicar Company Limited) and 4 parts by weight of an antistatic agent (SAT-4, manufactured by Nihon Junyaku Co., Ltd.), was coated on the substrate layer surface of the surface protection film, and the antistatic agent was coated on the release film surface by passing in an atmosphere wherein the antistatic agent was sprayed in a mist state, followed by drying by blowing hot air at 80° C. for 3 seconds, to obtain a surface protection film.

Example 9

To a surface protection film prepared in the same manner as in Example 7, a mixture comprising 1 part by weight of a silicone surfactant elastron (S-24, manufactured by Daiichi Kogyo Seiyaku Co., Ltd.) and 20 parts by weight of an antistatic agent (SAT-4, manufactured by Nihon Junyaku Co., Ltd.), was coated on the substrate layer surface of the surface protection film, and the antistatic agent was coated to the release film surface by passing in an atmosphere wherein the antistatic agent was sprayed in a mist state, followed by drying by blowing hot air at 80° C. for 3 seconds, to obtain a surface protection film.

Example 10

To a surface protection film prepared in the same manner as in Example 7, a mixture comprising 1 part by weight of a fluorine type emulsion (Elasgard 180, manufactured by Daiichi Kogyo Seiyaku Co., Ltd.) and 20 parts by weight of an antistatic agent (SAT-4, manufactured by Nihon Junyaku Co., Ltd.), was coated on the substrate layer surface of the surface protection film, and the antistatic agent was coated to the release film surface by passing in an atmosphere wherein the antistatic agent was sprayed in a mist state, followed by drying by blowing hot air at 80° C. for 3 seconds, to obtain a surface protection film.

Example 11

To a surface protection film prepared in the same manner as in Example 7, a mixture comprising 1 part by weight of a fluorine type surfactant (Phthagent 100, manufactured by NEOS Company Limited) and 1,000 parts by weight of an antistatic agent (SAT-4, manufactured by Nihon Junyaku Co., Ltd.), was coated on the substrate layer surface of the surface protection film, and the antistatic agent was coated to the release film surface by passing in an atmosphere wherein the antistatic agent was sprayed in a mist state, followed by drying by blowing hot air at 80° C. for 3 seconds, to obtain a surface protection film.

Example 12

To a surface protection film prepared in the same manner as in Example 7, a mixture comprising 1 part by weight of a dialkylsulfosuccinic acid ester salt (Adecacole EC, manufactured by Asahi Denka Kogyo K.K.) and 1,000 parts by weight of an antistatic agent (SAT-4, manufactured by Nihon Junyaku Co., Ltd.), was coated on the substrate layer surface of the surface protection film, and the antistatic agent was coated to the release film surface by passing in an atmosphere wherein the antistatic agent was sprayed in a mist state, followed by drying by blowing hot air at 80° C. for 3 seconds, to obtain a surface protection film.

Comparative Example 3

A surface protection film prepared in the same manner as in Example 7, was used without any further treatment.

The electrostatic state of the release film immediately after manually peeling the release film from the surface protection film of 200 mm×300 mm, was evaluated. The evaluation was made under the following standards.

⊚: The release film did not cling to the hand and fell when released from the hand.

○: The release film tended to cling to the hand to some extent but fell when released from the hand.

X: The release film clung to the hand and remained as clung to the hand even when released from the hand.

Evaluation of an Antifouling Property of the Substrate Layer

On the substrate layer surface of the surface protection film, an adhesive (acrylic adhesive AS-415 (manufactured by Ippousha Yushi Kogyo K.K.) having 0.03 part by weight of a crosslinking agent L-45 (manufactured by Soken Chemical & Engineering Co., Ltd.) mixed thereto) was bonded and wiped with paper, whereby the wiping efficiency was evaluated. The evaluation was made by the following standards.

⊚: The adhesive was wiped off by paper.

○: The adhesive was wiped off with paper having a solvent (toluene) impregnated thereto.

Δ: Even when wiped with paper having a solvent (toluene) impregnated thereto, the adhesive slightly remained on the surface.

X: The adhesive was not wiped off even by paper impregnated with a solvent (toluene).

TABLE 2

| | Electrostatic property after peeling the release layer | Antifouling property of the substrate layer |
|---|---|---|
| Ex. 7 | ◎ | ○ |
| Ex. 8 | ◎ | ○–◎ |
| Ex. 9 | ◎ | ◎ |
| Ex. 10 | ◎ | ◎ |
| Ex. 11 | ◎ | ◎ |
| Ex. 12 | ◎ | ◎ |
| Comp. Ex. 3 | X | X–Δ |

The surface protection films of Examples were useful for liquid crystal displays without any abnormal display.

Example 13

On one side of a polyester film (PET-SL, manufactured by Teijin Du Pont Film K.K.) having a thickness of 38 μm, a surfactant (SAT-4, Nihon Junyaku Co., Ltd.) having an antistatic property, was coated in a coating film thickness of 30 nm by a mist method and heated for a few second at a temperature of 100° C. to remove the diluting solvent. Further, likewise by a mist method, the same type of the coating agent was treated thereon under the same conditions to obtain a surface treated film having a final coating film thickness of 100 nm. Then, on the opposite side, an adhesive solution having 1.0 part by weight of a crosslinking agent (Collonate L-45, manufactured by Nippon Polyurethane Kogyo K.K.) mixed to 100 parts by weight of an acrylic adhesive (SK Dine 1473H, manufactured by Soken Chemical & Engineering Co., Ltd.) was coated by means of a bar coater. The thickness of the adhesive layer after drying at 100° C. for one minute, was about 10 μm.

Example 14

On one side of a polyester film (PET-SL, manufactured by Teijin Du Pont Film K.K.) having a thickness of 38 μm, a fluorine type surfactant (Phthagent FT-100, manufactured by NEOS Company Limited), was coated in a coating film thickness of 30 nm by a mist method, and further, likewise by a mist method, a surfactant (SAT-4, manufactured by Nihon Junyaku Co., Ltd.) having an antistatic property, was coated thereon to obtain a film having a final coating film thickness of 100 nm.

Comparative Example 4

On one side of a polyester film (PET-SL, manufactured by Teijin Du Pont Film K.K.) having a thickness of 38 μm, a commercially available ultraviolet curable silicone solution was coated by a gravure roll coater and irradiated with ultraviolet rays for 30 seconds to form a cured film. The thickness of the obtained coating film was 100 nm.

Comparative Example 5

On one side of a polyester film (PET-SL, manufactured by Teijin Du Pont Film K.K.) having a thickness of 38 μm, a surfactant (SAT-4, manufactured by Nihon Junyaku Co., Ltd.) having an antistatic property was coated by a mist method in a coating film thickness of 0.5 nm.

The evaluation methods for the cohesiveness, the antifouling property and the ink adhesion in Examples and Comparative Examples were as follows.

Evaluation of Cohesiveness

In the above-mentioned evaluation method for the cohesiveness, the degree of failure was evaluated by the following standards.

A: Cohesion Failure within the Surfactant Layer

After peeling the adhesive tape, the surfactant component was confirmed on both the treated surface of the surface-treated film and the adhesive surface of the adhesive tape.

B: Interfacial Failure at the Interface Between the Surfactant and the Base Film After peeling the adhesive tape, the surfactant component was confirmed only on the adhesive tape side.

C: No Failure was Observed in or Between the Layers.

After peeling the adhesive tape, the surfactant component was confirmed only on the treated surface side of the surface-treated film.

Antifouling Property

On a release-treated surface of a polyester film (E7002, manufactured by Toyo Boseki K.K.) having a thickness of 25 μm and having release treatment applied to one side, an adhesive solution having 1.0 part by weight of a crosslinking agent (Collonate L-45, manufactured by Nippon Polyurethane Kogyo K.K.) mixed to 100 parts by weight of an acrylic adhesive (SK Dine 1473H, manufactured by Soken Chemical & Engineering Co., Ltd.), was coated by means of a bar coater and dried at 100° C. for two minutes. The adhesive side of the adhesive coating film was rubbed against the coating layer of the film disclosed in each Example or Comparative Example, and only the attached adhesive was wiped by a JK wiper 150-S, manufactured by Cresia Company, whereby the wiping efficiency was evaluated.

○: The adhesive attached on the surface was completely wiped off, and no trace of wiping remained.

X: The adhesive was not completely wiped off and remained on the surface.

Ink Adhesion

Quick drying round-shaped seal No. 11 (color: red) manufactured by Shachihata K.K. was stamped on the coating layer of the film disclosed in each Example or Comparative Example and left to stand at room temperature for 5 minutes, whereupon it was wiped by means of a JK wiper 150-S, manufactured by Cresia Company, whereby the degree of removal of the ink was evaluated.

○: The ink remained in the stamped shape.

X: A part or all of the ink was removed.

The evaluation results by the foregoing evaluation methods are shown in Table 3.

TABLE 3

| | Evaluation of cohesiveness | Antifouling property | Ink adhesion |
|---|---|---|---|
| Ex. 13 | A | ○ | ○ |
| Ex. 14 | A | ○ | ○ |
| Comp. Ex. 4 | C | ○ | X |
| Comp. Ex. 5 | B | X | ○ |

Measurement of 180° Peel Strength of the Surface Protection Film

The measurement of the 180° peel strength of the surface protection film was carried out by bonding the adhesive layer surface of the surface protection film of 25 mm×150 mm to the roughened surface (Ra=390 nm) of a commercially available polarizing plate (30 mm×150 mm) by reciprocating a 2 kg rubber roll once, and it was peeled by a tensile tester at a peeling rate of 300 mm/min or 5,000 mm/min, whereby the peel strength was measured.

Measurement of the Initial Peel Strength of the Surface Protection Film

The measurement of the initial peel strength of the surface protection film was carried out by pressing a stainless steel probe having a diameter of 5 mm to the adhesive layer side of the surface protection film at a pressing rate of 120 mm/min under a pressing force of 20 gf/φ 5 mm for one second and withdrawn at a withdrawing rate of 600 mm/min, whereby the peel strength was measured.

Measurement of the Haze of the Surface Protection Film

The measurement of the haze of the surface protection film was carried out by using a haze measuring machine (manufactured by Reska Company).

Evaluation of the Adhesion of the Surface Protection Film

The measurement of the adhesion of the surface protection film was carried out by bonding the adhesive layer side of the surface protection film to the surface-roughened side (Ra=390 nm) of a commercially available polarizing plate by reciprocating a 2 kg rubber roll once, whereby the adhesion was evaluated. The evaluation was made by the following standards.

○: No inclusion of fine air bubbles was observed, and transparent.

Δ: Inclusion of fine air bubbles was slightly observed, but transparent.

X: Inclusion of fine air bubbles was observed, and turbid.

Example 15

Using a polyethylene terephthalate resin film (G2P8, manufactured by Teijin Du Pont K.K.) having a thickness of 38 μm as the substrate layer, an acrylic adhesive SK1496 (manufactured by Soken Chemical & Engineering Co., Ltd.) having 1 part by weight of a crosslinking agent D-90 (manufactured by Soken Chemical & Engineering Co., Ltd.), 0.1 part by weight of an accelerator S (manufactured by Soken Chemical & Engineering Co., Ltd.) and 10 parts by weight of a plasticizer Sansocizer DUP (manufactured by Shin-Nippon Rika K.K.) mixed thereto, was coated on the antistatic treated side of this film in a thickness of 23 μm (after drying) by means of a comma coater and dried at 100° C. for one minute. Then, as a release film, a polyethylene terephthalate resin film E7002 (manufactured by Toyo Boseki K.K.) having a thickness of 25 μm and having silicone coated on one side, was bonded to the adhesive side, to obtain a surface protection film.

Example 16

In the same manner as in Example 15, a surface protection film was prepared by using 10 parts by weight of Sansocizer DINP (manufactured by Shin-Nippon Rika K.K.) instead of the plasticizer Sansocizer DUP.

Comparative Example 6

In the same manner as in Example 15, a surface protection film was prepared without adding the plasticizer.

TABLE 4

|  | Ex. 15 | Ex. 16 | Comp. Ex. 6 |
|---|---|---|---|
| Measurement of 180° peel strength Peeling rate: 300 mm/min N/25 mm | 0.04 | 0.05 | 0.13 |
| Measurement of 180° peel strength Peeling rate: 5,000 mm/min N/25 mm | 0.33 | 0.33 | 0.60 |
| Measurement of initial peel strength N/φ5 mm | 1.9 | 1.8 | 1.7 |
| Measurement of haze (%) | 3.8 | 4.1 | 3.9 |
| Evaluation of adhesion | ○ | ○ | Δ |

The surface protection films of Examples were useful for liquid crystal displays without any abnormal display.

According to Examples of the present invention, it is possible to obtain a surface protection film which is capable of protecting a liquid display without bringing about an abnormal display of a liquid crystal display due to electrostatic charge by peeling generated at the time of peeling the surface protection film of the liquid crystal display.

In a two-part crosslinkable acrylic adhesive prepared by mixing a main agent and a crosslinking agent, by adjusting the blend ratio of the main agent and the crosslinking agent properly, it is possible to obtain a surface protection film which not only protects the surface but suppresses the electrostatic phenomenon at the time of peeling.

In Examples 7 to 12, static electricity generated at the time of peeling a release film from the surface protection film, can be substantially suppressed, and accordingly, when it is used as a surface protection film for a liquid display, the abnormal display can be reduced. The antifouling property of the substrate layer is also good in Examples. It is possible to readily remove dust, an adhesive, finger prints, etc. from the surface of the substrate layer of the surface protection film.

According to Examples of the present invention, it is possible to obtain a surface protection film having a 180° peeling strength sufficiently small even within a peeling speed range of manual peeling and which is excellent in adhesion even when bonded to a surface subjected to surface roughening treatment such as a liquid crystal display surface subjected to anti-glare treatment.

By forming a thin film made of a surfactant having a lower cohesive force than the bond strength with the base film, on the outermost surface of the film, it becomes possible to satisfy both the antifouling property and the ink adhesion.

The invention claimed is:

1. A surface protection film which comprises
a substrate layer and
an adhesive layer,
wherein the electrostatic charge by peeling the surface protection film from an adherend is from +0.01 to −0.01 nC/mm$^2$; and
wherein the substrate layer has on its surface at least one antistatic agent selected from the group consisting of a poly(oxyethylene)alkylamine, a poly(oxyethylene) alkylamide, a poly(oxyethylene)alkyl ether, a poly (oxyethylene)alkyl phenyl ether, a glycerol fatty ester, a sorbitan fatty acid ester, an alkylbetaine, an alkylimidazoline, and an alkylalanine.

2. The surface protection film according to claim 1, wherein the adherend is a film made of a triacetyl cellulose resin.

3. The surface protection film according to claim 1, wherein a two-part crosslinkable acrylic adhesive is used for the adhesive layer.

4. The surface protection film according to claim 3, wherein the two-part crosslinkable acrylic adhesive has a glass transition temperature of at least −60° C.

5. The surface protection film according to claim 3, wherein the two-part crosslinkable acrylic adhesive has a glass transition temperature of at least −40° C.

6. The surface protection film according to claim 3, wherein the two-part crosslinkable acrylic adhesive comprises a main agent and a crosslinking agent in such a blend ratio that the crosslinking agent is from 0.01 to 10 parts by weight per 100 parts by weight of the main agent.

7. The surface protection film according to claim 6, wherein the crosslinking agent is an isocyanate type crosslinking agent.

8. A paster which comprises
an adherend and
a surface protection film;
wherein the electrostatic charge by peeling the adherend from the surface protection film is from +0.01 to −0.01 nC/mm$^2$;
wherein the surface protection film comprises at least one antistatic agent selected from the group consisting of a poly(oxyethylene)alkylamine, a poly(oxyethylene)alkylamide, a poly(oxyethylene)alkyl ether, a poly(oxyethylene)alkyl phenyl ether, a glycerol fatty ester, a sorbitan fatty acid ester, an alkylbetaine, an alkylimidazoline, and an alkylalanine.

9. The surface protection film according to claim 1, wherein the at least one antistatic agent selected from the group consisting of a an alkylbetaine, an alkylimidazoline, and an alkylalanine.

10. The paster according to claim 8, wherein the at least one antistatic agent selected from the group consisting of a an alkylbetaine, an alkylimidazoline, and an alkylalanine.

* * * * *